United States Patent [19]
Sanchez

[11] Patent Number: 6,160,305
[45] Date of Patent: Dec. 12, 2000

[54] BETA DEPENDENT TEMPERATURE SENSOR FOR AN INTEGRATED CIRCUIT

[75] Inventor: Hector Sanchez, Cedar Park, Tex.

[73] Assignee: Motorola, Inc., Schaumburg, Ill.

[21] Appl. No.: 08/777,924

[22] Filed: Dec. 23, 1996

[51] Int. Cl.[7] .................. H01L 31/058; H01L 27/082; H01L 27/102; H01L 29/70
[52] U.S. Cl. ............................ 257/565; 257/467
[58] Field of Search ..................... 257/467, 470, 257/565

[56] References Cited

U.S. PATENT DOCUMENTS

| | | | |
|---|---|---|---|
| 4,639,755 | 1/1987 | Namiki et al. | 257/470 |
| 5,195,827 | 3/1993 | Audy et al. | 374/172 |
| 5,451,892 | 9/1995 | Bailey | 327/113 |
| 5,487,127 | 1/1996 | Bertoluzzi et al. | 331/69 |
| 5,815,358 | 9/1998 | Tihanyi | 361/103 |
| 6,046,492 | 4/2000 | Machida et al. | 257/567 |

*Primary Examiner*—Olik Chaudhuri
*Assistant Examiner*—Howard Weiss
*Attorney, Agent, or Firm*—Lee E. Chastain

[57] ABSTRACT

A thermal sensing element (10) incorporates a vertical pnp bipolar transistor (12) whose BETA is dependent on temperature. This known relationship can be used to build a temperature sensor (200, 300), that is inexpensive, reliable, and whose process variance is predictable.

26 Claims, 2 Drawing Sheets

BETA DEPENDENT TEMPERATURE SENSOR FOR AN INTEGRATED CIRCUIT

FIELD OF THE INVENTION

The present invention generally relates to electronic circuits, and more specifically to circuits for sensing temperature.

BACKGROUND OF THE INVENTION

Temperature sensors are devices used to detect the temperature of a device that contains the sensor or is physically located near to the sensor. In this way, the operation of a circuit may be controlled as a function of its temperature. Such control may be advantageous in the case of applications that require heat dissipating devices, and for other purposes. For instance, it may be necessary to incorporate a heat sink in an integrated circuit, or to force air over the integrated circuit if the integrated circuit has the potential of ever exceeding the passive cooling ability of the integrated circuit. With a temperature sensor, it may be possible to avoid these instances and, thus, to avoid the requirement of a heat sink, fan, etc. altogether.

Known thermal sensors have traditionally relied on complex discrete solutions. For instance, known thermal sensors incorporate resistors, capacitors, operational amplifiers, and ring oscillators to detect changes in temperature. Unfortunately, these devices may be incompatible with modern, complementary metal oxides semiconductor (CMOS) manufacturing processes. And, these solutions may require complex control circuitry to operate.

Other known solutions are not fully integrated. A fully integrated solution is one in which the sensing element resides on the same integrated circuit whose temperature is of interest. Instead, prior solutions have located a sensing element near to the device of interest. This solution is more expensive and less responsive to temperature changes. These non-integrated solutions are less responsive to temperature changes due to the thermal resistance between the external sensor and the device of interest.

SUMMARY OF THE INVENTION

In one aspect of the present invention, a thermal sensing element incorporates a vertical pnp bipolar transistor whose BETA, or current amplification factor, is dependent on temperature. The base current of the bipolar transistor is amplified by the BETA, as a function of temperature, resulting in an emiter current which may be measured as a function of temperature. This known relationship can be used to build a temperature sensor, that is inexpensive, reliable, and whose process variance is predictable.

In another aspect of the present invention, a temperature sensor includes a plurality of thermal sensing elements connected in series. A digital to analog converter is coupled in series with the chain of sensors to allow a known percentage of its input current to its output terminal.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
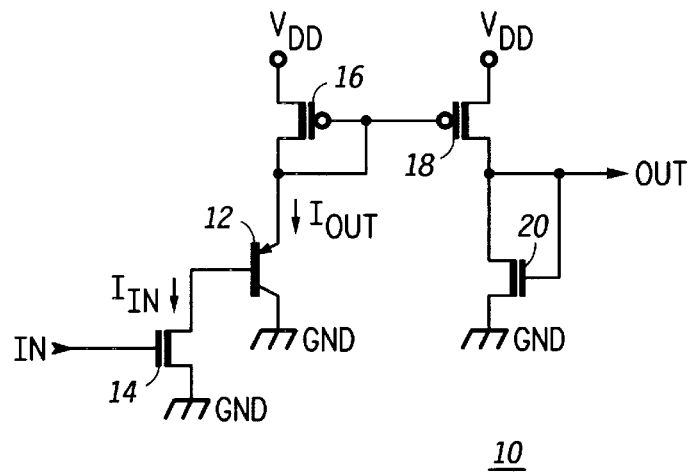
FIG. 1 depicts a circuit diagram of a temperature sensing element constructed in accordance with the present invention.

FIG. 1 depicts a circuit diagram of a temperature sensing element 10 constructed in accordance with the present invention. Temperature sensing element 10 incorporates a vertical pnp bipolar transistor 12 whose base current is amplified by the BETA of vertical pnp bipolar transistor 12. The BETA of vertical pnp bipolar transistor 12 is strongly dependent upon the temperature of vertical pnp bipolar transistor 12 and of the integrated die which incorporates vertical pnp bipolar transistor 12. Temperature sensing element 10 may be incorporated into a fully integrated thermal sensor. Temperature sensing element 10 does not require any complex analog elements to function. Instead, a known current input to the base of vertical pnp bipolar transistor 12 is amplified as a function of temperature. This amplified current may be detected and compared to the known current for temperature sensing purposes.

Continuing with FIG. 1, a base of vertical pnp bipolar transistor 12 is connected to a first current electrode of an n-type transistor 14. A control electrode of transistor 14 receives the input voltage IN. A second current electrode of transistor 14 receives the voltage ground (GND). Similarly, the collector of vertical pnp bipolar transistor 12 receives the voltage ground, GND. An emitter of vertical pnp bipolar transistor 12 is coupled to a first current electrode and to a control electrode of p-type transistor 16. A second current electrode of transistor 16 receives the supply voltage, $V_{DD}$. The control electrode and the first current electrode of transistor 16 are also coupled to a control electrode of a p-type transistor 18. A first current electrode and a second current electrode of transistor 18 is coupled to the supply voltage, $V_{DD}$, and to a first control electrode of an n-type transistor 20, respectively. A control electrode and a second current electrode of transistor 20 are coupled to the first current electrode of transistor 20 and to the ground voltage supply GND, respectively. The control electrode of transistor 20 generates the output voltage, OUT.

In the depicted embodiment, thermal sensing element 10 is fabricated in a complimentary metal oxide semiconductor (CMOS) process. As described above, bipolar transistor 12 is a vertical pnp transistor. In particular, the emitter, base, and collector of bipolar transistor 12 are the p-type implant region in an n-well, the n-well, and the p-type substrate, respectively. In other embodiments, bipolar transistor 12 could be fabricated in other ways, including by a conventional bipolar process.

In operation, a known input voltage is supplied to the control electrode of transistor 14 causing a known current $I_{IN}$ at the base of vertical pnp bipolar transistor 12. The BETA of vertical pnp bipolar transistor 12 amplifies the current $I_{IN}$, to form the emitter current $I_{OUT}$. This emitter current, $I_{OUT}$, is mirrored by transistors 16 and 18 to the output terminal out.

Generally, $$I_{OUT}=I_{IN}*(1+BETA(T))  \quad \text{Equation (1)}$$

where, $$BETA(T)=BETA0*(T/T0)^{XTB} \quad \text{Equation (2)}$$

XTB is the temperature coefficient of BETA (typically 1.75), BETA0 is the nominal room temperature BETA of vertical pnp bipolar transistor 12, T is the temperature of the sensor in degrees Kelvin, and T0 is the room temperature in degrees Kelvin (298° K.). Consequently, $I_{OUT}$ is a predictable function of temperature.

In the depicted embodiment, transistors 16 and 18 are the same size and the difference between $V_{DD}$ and GND is 2.5 Volts. In other embodiments, transistors 16 and 18 could be sized differently or the voltage difference between $V_{DD}$ and GND could be larger. In the embodiment in which transistors 16 and 18 are sized differently, the emitter current would be further amplified by the ratio of the size of the transistor 18 to the size of transistor 16. In the embodiment in which the difference between $V_{DD}$ and GND is greater than 2.5 Volts, the single vertical pnp bipolar transistor 12 could be replaced with a string of bipolar devices connected base to emitter, with a common source connection. This configuration is known as a Darlington chain. Again, the emitter current would be amplified. In this case, the emitter current would be the geometric product of the (1+BETA) of each transistor in the Darlington chain.

Figure 2:
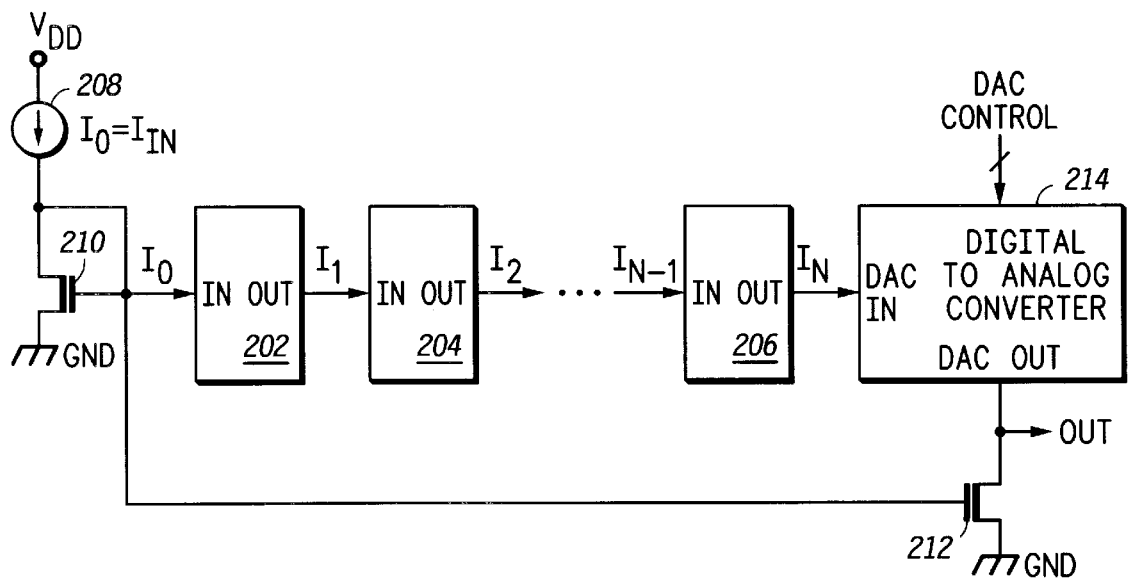
FIG. 2 depicts a partial block diagram, partial circuit diagram of a first embodiment of a beta dependent temperature sensor constructed in accordance with the present invention.

FIG. 2 depicts a partial block diagram, partial circuit diagram of a first embodiment of a BETA dependent temperature sensor 200 constructed in accordance with the present invention. In temperature sensor 200, N temperature sensing elements are connected in series and are labeled 202, 204, and 206. N is a non-zero integer. The input terminal of temperature sensing element 202 is connected to a control electrode of an n-type transistor 210. Otherwise, the IN terminal of the Mth temperature sensing element is coupled to the OUT terminal of the (M−1) temperature sensing circuit, where M is an integer index ranging from 2 to N. A first current electrode and second electrode of transistor 210 are coupled to a first terminal of current generator 208 and to a ground voltage, GND, respectively. A second terminal of current generator 208 receives the supply voltage, $V_{DD}$. Current generator 208 may be a bandgap reference voltage type current generator. The control electrode of transistor 210 is also coupled to its first current electrode and to a control electrode of an n-type transistor 212. A first current electrode and a second current electrode of transistor 212 is coupled to a DAC OUT of a digital to analog converter 214 and to the ground voltage, GND, respectively.

A DAC IN terminal of digital to analog converter 214 receives the out signal generated by the Nth temperature sensing element in temperature sensor 200, here temperature sensing element 206. The DAC OUT terminal generates an output current, $I_{DAC\ OUT}$, that is sourced to a node OUT. Also, transistor 212 sinks a predetermined current, $I_{IN}$, from node OUT. An inverter (not shown) may be connected to the OUT node to convert the analog output to a digital output.

In operation, current generator 208 supplies a known current ($I_0$ or $I_{IN}$) to the control electrode of transistor 14 in temperature sensing element 202. This known current is mirrored to the source of vertical pnp bipolar transistor 12. As described, the BETA of vertical pnp bipolar transistor 12 amplifies this current in a known way. Each subsequent temperature sensing element in temperature sensor 200 further amplifies this current until it is output to digital to analog converter 214. Digital to analog converter 214 increments or decrements its input current responsive to the control signals present on DAC CONTROL. In this manner, digital to analog converter 214 can supply a known percentage of its input current to its output terminal DAC OUT.

Transistor 212 also mirrors the known current ($I_0$ or $I_{IN}$), sinking it from the output terminal of digital to analog converter 214. If digital to analog converter 214 sources more current to its output terminal than transistor 212 sinks, then the output terminal will indicate a positive value. Similarly, if digital to analog converter 214 sources less current to its output terminal than does transistor 212, then the output terminal will register a low value. In this manner, temperature sensor 200 can determine whether its temperature is greater or less than a known value as indicated by the inputs digital to analog converter 214.

The operating characteristics of temperature sensor 200 are dependent on the number of thermal sensing elements 10 incorporated into its design. As described above in connection equation (1) the output current of each temperature sensing element is a function of its temperature. Specifically, $$I_{DAC\ IN}=I_{IN}*(1+BETA(T))^N \quad \text{Equation (3)}$$

therefore, the output current difference, ΔI, which is generated at the OUT node is:

$$\Delta I=I_{OUT}-I_{IN} \quad \text{Equation (4)}$$

$$\Delta I=I_{IN}(1+BETA(T))^N-I_{IN} \quad \text{Equation (5)}$$

assuming that digital to analog converter 214 does not moderate $I_{OUT}$. Equation (5) can be expanded by a binomial series representation of $(1+X)^N$:

$$\Delta I=I_{IN}*(1+N*BETA(T)+N*(N-1)*BETA(T)^2/2!+ \ldots$$
$$(N*(N-1) \ldots (N-K+1))*BETA(T)_K/K!+ \ldots +$$
$$BETA(T)^N)-I_{IN} \quad \text{Equation (6)}$$

For instance, if N=3 then $$\Delta I=I_{IN}*(3*BETA(T)+3*BETA(T)^2+BETA(T)^3) \quad \text{Equation (7)}$$

Figure 3:
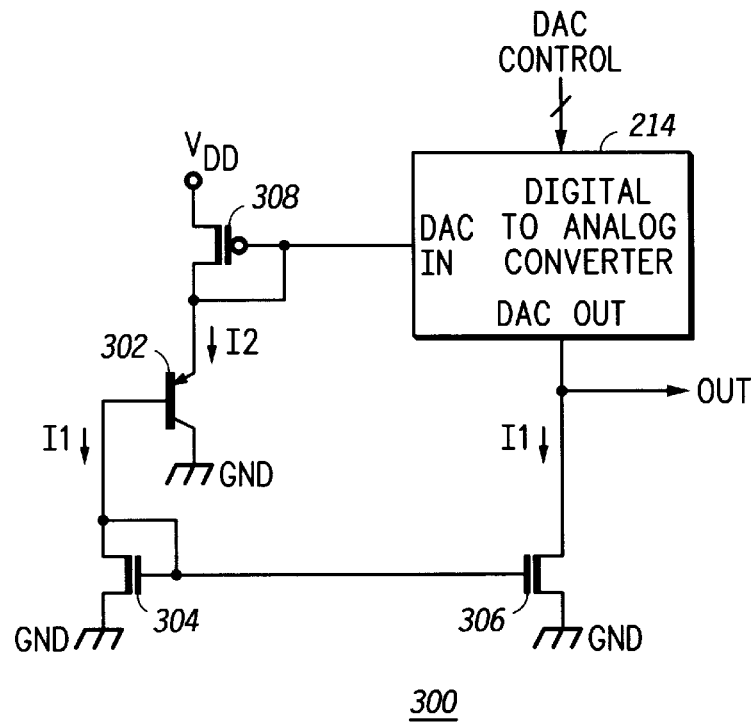
FIG. 3 depicts a partial block diagram, partial circuit diagram of a second embodiment of a beta dependent temperature sensor constructed in accordance with the present invention.

FIG. 3 depicts a partial block diagram, partial circuit diagram of a second embodiment of a BETA dependent temperature sensor 300 constructed in accordance with the present invention. Here, a base of a vertical pnp bipolar transistor 302 is connected to a first current electrode and to a control electrode of an n-type transistor 304. A collector of vertical pnp bipolar transistor 302 and the second current electrode of transistor 304 receive the ground voltage, GND. The control electrode of transistor 304 is also coupled to a control electrode of an n-type transistor 306. A first current electrode and a second current electrode of transistor 306 is connected to the DAC OUT terminal of digital to analog converter 214 and to the ground voltage, GND, respectively. An emitter of vertical pnp bipolar transistor 302 is connected to a first current electrode and to control electrode of a p-type transistor 308. A second control electrode of transistor 308 receives the supply voltage, $V_{DD}$. The first current electrode and the control electrode of transistor 308 are also connected to the DAC IN terminal of digital to analog converter 214.

In operation, the BETA of vertical pnp bipolar transistor 302 amplifies its base current, I1, depending upon its temperature. Again, digital to analog converter 214 modulates this current where it is compared against the current sunk from transistor 306. Here, however, both the BETA of vertical pnp bipolar transistor 302 and the base current, $I_1$, vary as a function of temperature:

$$I2 = I1*(1+BETA(T)) \quad \text{Equation (7)}$$

and $$\Delta I = I2 - I1 \quad \text{Equation (8)}$$

or $$\Delta I = BETA(T)*I2/(1+BETA(T)) \quad \text{Equation (9).}$$

Recalling Equation (2) above and substituting it into Equation (9), $$\Delta I = I2(T)*BETA0*(T/T0)^{XTB}/(1+BETA0*(T/T0)^{XTB}) \quad \text{Equation (10).}$$

The term I2(T) can be replaced with the relationship:

$$I2(T) = I_{SATURATION}(T) * e^{K/T} \quad \text{Equation (11),}$$

where:

$$I_{SATURATION}(T) = I_{SO}*(T/T0)^{XTI} \quad \text{Equation (12)}$$

and $$e^{K/T} \sim K*(1-T^2/2-T^3/6) \quad \text{Equation (13).}$$

XTI is the temperature coefficient of the saturation current (typically 2). Therefore, $$I2(T) \sim I_{SO}*(T/T_0)^{XTI}*K*(1-T+T^2/2-T^3/6) \quad \text{Equation (12).}$$

Substituting Equation 12 into Equation (10) yields the result:

$$\Delta I \sim I_{SO}*(T/T_0)^{XTI}*(K*(1-T+T^2/2-T^3/6))*BETA0*(T/T0)^{XTB}/(1+BETA0*(T/T_0)^{XTB}) \quad \text{Equation (13).}$$

Therefore, the current difference at the DAC OUT terminal of digital to analog converter 214 is a predictable function of temperature.

Figure 4:
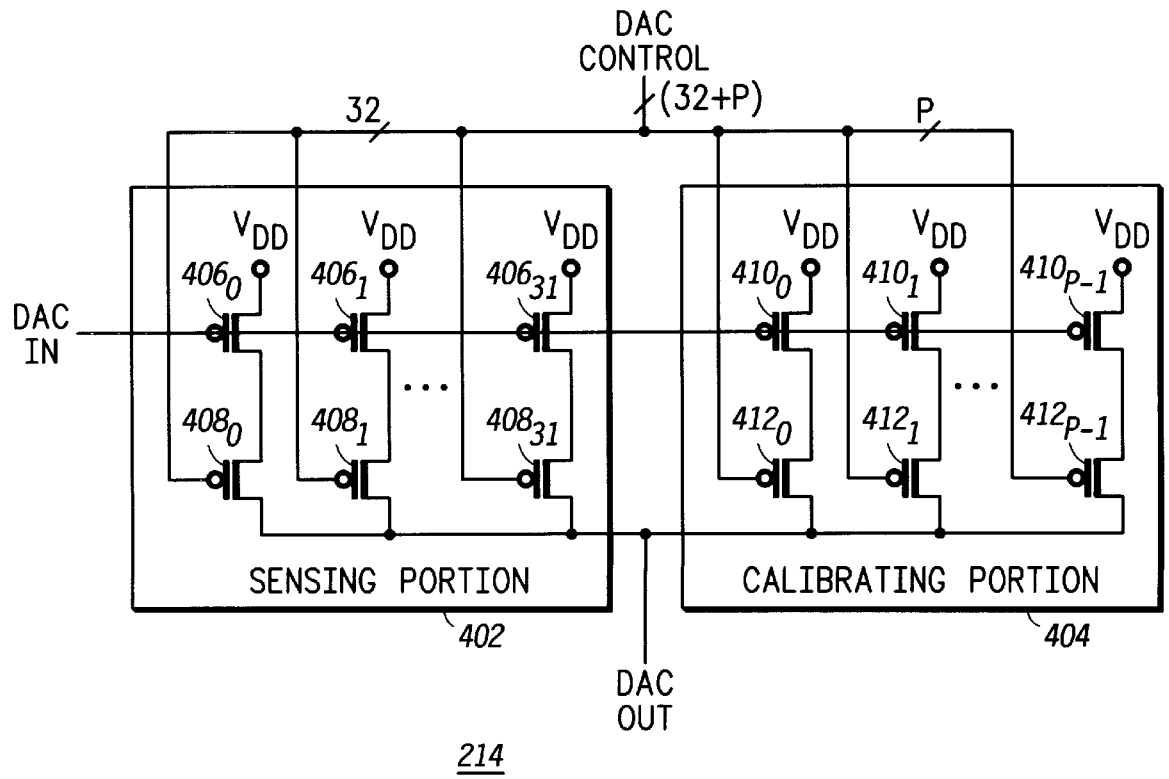
FIG. 4 depicts a circuit diagram of a digital-to-analog converter illustrated in FIGS. 2 and 3.

FIG. 4 depicts a circuit diagram of digital to analog converter 214 illustrated in FIGS. 2 and 3. Digital to analog converter 214 comprises a sensing portion 402 and a calibrating portion 404. Sensing portion 402 is used to modulate the current output to transistors 212 (FIG. 2) and 306 (FIG. 3). As described above, when this output is equal to the current sunk by transistors 212 or 306, then the temperature of the thermal sensor can be determined. Calibrating portion 404 is used to supply a fixed current to transistors 212 or 306 to compensate for the variation of BETA0 in vertical pnp bipolar transistors 12 and 302.

Continuing with sensing portion 402, 32 pairs of p-type transistors are connected in series between the supply voltage, $V_{DD}$, and the output node DAC OUT. In particular, a first current electrode, a control electrode, and a second current electrode of a p-type transistor $406_i$ is connected to the supply voltage $V_{DD}$, to the input terminal DAC IN, and to a first current electrode of a transistor $408_i$, where $i$ is an integer index ranging from 0 to 31. A control electrode and a second current electrode of transistor $408_i$ is connected to receive an with one of the inputs DAC CONTROL and to the output terminal DAC OUT, respectively. In the preferred embodiment, there are 32 individual switches in sensing portion 402. One skilled in the art will readily appreciate that the number may be varied to suit the particular application and the desired resolution of the application in which digital to analog converter 214 is incorporated.

The sizes and number of transistors $406_i$ are determined by the previous equations or empirically by simulating the expected operating temperatures. In particular, the emitter current of vertical pnp bipolar transistor 12 and/or 302 is modeled at a particular minimum expected temperature. From this model, a certain minimum expected emitter current is predicted. This emitter current is matched by a certain number(s) of transistors $406_i$ in digital to analog converter 214. This particular transistor(s) is always on. From the minimum expected temperature, incremental temperatures are modeled, generating incremental emitter currents. These incremental emitter currents are matched with individual incremental transistors $406_i$. The desired granularity of temperature detection determines the number of incremental temperature calculations that are performed. Transistors $406_i$ may be used in combination with each other to reduce the total number of transistor pairs required.

Continuing with calibrating portion 404, P pairs of p-type transistors are connected in series between the supply voltage, $V_{DD}$, and the output node DAC OUT, where P is a non-zero integer. In particular, a first current electrode, a control electrode, and a second current electrode of a p-type transistor $410_j$ is connected to the supply voltage $V_{DD}$, to the input terminal DAC IN, and to a first current electrode of a transistor $412_j$, respectively, where j is an integer index ranging from 0 to (P–1). A control electrode and a second current electrode of transistor $412_j$ is connected to receive a (j+32)nd one of the inputs DAC CONTROL and to the output terminal DAC OUT, respectively. One skilled in the art will readily appreciate that the number of transistor pairs in calibrating portion 404 may be varied to suit the particular application and the desired resolution of the application in which digital to analog converter 214 is incorporated.

The sizes and number of transistors $410_P$ are also determined empirically. Here, the expected process corners and the corresponding BETAO values of temperature sensor 200 or 300 are simulated. Process corners define the expected range of physical variations caused by the manufacturing process used to fabricate temperature sensor 200 or 300. In particular, the emitter current of vertical pnp bipolar transistor 12 and/or 302 is modeled at each process corner. From this model, a range of possible emitter currents is predicted. This range is matched by a certain number of transistors 410i in digital to analog converter 214 that can generate a range of matching currents. Transistors $410_i$ may be used in combination with each other to reduce the total number of transistor pairs required. A circuit that controls digital to analog converter 214 or a user (neither shown) determines which transistors should be enabled to compensate for the particular BETA0 after a particular thermal sensor is manufactured. Such a calculation is performed by sensing a known temperature, inputting the DAC IN control signals corresponding to the known temperature to sensing portion 402, and enabling or disabling transistors 412i until the output of digital to analog converter 214 indicates the expected value. The inclusion of calibrating portion 404 ensures that the sensing portion 402 will operate correctly over its entire expected temperature range independent of manufacturing variations.

Although the present invention has been described with reference to a specific embodiment, further modifications and improvements will occur to those skilled in the art. For instance, the disclosed invention may be incorporated into a dual-ended thermal sensor for noise immunity. In a dual-ended design, the output of digital to analog converter 214 and the output of transistor 212/306 are each mirrored to a first and to a second node. In the case of the first node, digital to analog converter 214 sources current to the node and transistor 212/206 sinks current from the node (as shown in FIGS. 2 and 3). In the case of the second node, digital to analog converter 214 sinks current from the node and transistor 212/206 sources current to the node. The first and second node are then coupled to the two inputs of a operational amplifier for a final comparison. It is to be understood therefore, that the invention encompasses all such modifications that do not depart from the spirit and scope of the invention as defined in the appended claims.

What is claimed is:

1. A beta dependent temperature sensor comprising:
    a bipolar transistor comprising a first current electrode, a second current electrode and a control electrode, the second current electrode being coupled to a reference voltage;
    a current generating device coupled to the control electrode of the bipolar transistor; and
    a current sensing circuit detecting a current flowing through the first current electrode of the bipolar transistor.

2. The beta dependent temperature sensor of claim 1 wherein the current generating device comprises a constant current source and wherein the current generating device further comprises a first transistor further comprising a first current electrode, a second current electrode and a control electrode, the first current electrode coupled to the control electrode of the bipolar transistor, and the control electrode of the first transistor coupled to the constant current source.

3. The beta dependent temperature sensor of claim 2 wherein the current sensing circuit comprises a digital to analog converter providing a current output responsive to programmable inputs to the digital to analog converter and the current flowing through the first current electrode of the bipolar transistor.

4. The beta dependent temperature sensor of claim 3 wherein the digital to analog converter comprises calibration circuitry and sensing circuitry.

5. The beta dependent temperature sensor of claim 4 wherein the bipolar transistor is a vertical bipolar transistor.

6. The beta dependent temperature sensor of claim 3 wherein the bipolar transistor is a vertical bipolar transistor.

7. The beta dependent temperature sensor of claim 2 wherein the bipolar transistor is a vertical bipolar transistor.

8. The beta dependent temperature sensor of claim 1 wherein the current sensing device comprises:
    a second transistor comprising a first current electrode, a second current electrode and a control electrode, wherein the control electrode and the first current electrode thereof are coupled to each other and the control electrode of the bipolar transistor; and
    a third transistor comprising a first current electrode, a second current electrode and a control electrode, wherein the first current electrode thereof is coupled to an output node and the control electrode thereof is coupled to the control electrode of the second transistor.

9. The beta dependent temperature sensor of claim 8 wherein the current sensing circuit comprises a digital to analog converter providing an output current responsive to programmable inputs and the current flowing through the first current electrode of the bipolar transistor.

10. The beta dependent temperature sensor of claim 9 wherein the digital to analog converter comprises calibration circuitry and sensing circuitry.

11. The beta dependent temperature sensor of claim 10 wherein the bipolar transistor is a vertical bipolar transistor.

12. The beta dependent temperature sensor of claim 9 wherein the bipolar transistor is a vertical bipolar transistor.

13. The beta dependent temperature sensor of claim 8 wherein the bipolar transistor is a vertical bipolar transistor.

14. The beta dependent temperature sensor of claim 1 wherein the bipolar transistor is a vertical bipolar transistor.

15. A temperature sensor for comparing a predetermined temperature threshold to a temperature of an integrated circuit comprising:
    N temperature sensing elements, where N is a non-zero integer, each one of the N temperature sensing elements comprising an input terminal and an output terminal, an With one of the N temperature sensing elements coupled to an (I-1)th one of the N temperature sensing elements, where I is an integer index ranging from 2 to N, each of the N temperature sensing elements further comprising:
        a bipolar transistor comprising a first current electrode, a second current electrode and a control electrode the second current electrode being coupled to a reference voltage;
    a current generating device coupled to the control electrode of the bipolar transistor of a first one of the N temperature sensing, elements;
    a digital to analog converter generating a first current to an output node responsive to an output of an Nth one of the N temperature sensing elements; and
    a first current generating circuit generating a second current to the output node responsive to the current generating device.

16. The temperature sensor of claim 15 wherein the first current generating circuit comprises a first transistor further comprising a first current electrode, a second current electrode, and a gate electrode, the first current electrode coupled to the output node and the control electrode coupled to the current generating device.

17. The temperature sensor of claim 16 wherein the bipolar transistor is a vertical bipolar transistor.

18. The temperature sensor of claim 17 wherein the digital to analog converter comprises calibration circuitry and sensing circuitry.

19. The temperature sensor of claim 16 wherein the digital to analog converter comprises calibration circuitry and sensing circuitry.

20. The temperature sensor of claim 15 wherein the current generating device comprises a first transistor further comprising a first current electrode, a second current electrode, and a gate electrode, the first current electrode and the control electrode coupled to the control electrode of the bipolar transistor of the first one of the N temperature sensing elements.

21. The temperature sensor of claim 20 wherein the bipolar transistor is a vertical bipolar transistor.

22. The temperature sensor of claim 21 wherein the digital to analog converter comprises calibration circuitry and sensing circuitry.

23. The temperature sensor of claim 20 wherein the digital to analog converter comprises calibration circuitry and sensing circuitry.

24. The temperature sensor of claim 15 wherein the bipolar transistor is a vertical bipolar transistor.

25. The temperature sensor of claim 24 wherein the digital to analog converter comprises calibration circuitry and sensing circuitry.

26. The temperature sensor of claim 15 wherein the digital to analog converter comprises calibration circuitry and sensing circuitry.

* * * * *

UNITED STATES PATENT AND TRADEMARK OFFICE
CERTIFICATE OF CORRECTION

PATENT NO. : 6,160,305
DATED : December 12, 2000
INVENTOR(S) : Hector Sanchez

It is certified that error appears in the above-identified patent and that said Letters Patent is hereby corrected as shown below:

Claim 15, column 8, lines 11;
    Change "Wlth" to read - -lth- -

Signed and Sealed this

First Day of May, 2001

Attest:

NICHOLAS P. GODICI

*Attesting Officer*      *Acting Director of the United States Patent and Trademark Office*